(12) United States Patent
Baek et al.

(10) Patent No.: US 10,490,879 B2
(45) Date of Patent: Nov. 26, 2019

(54) ANTENNA DEVICE AND ELECTRONIC DEVICE INCLUDING THE SAME

(71) Applicant: Samsung Electronics Co., Ltd., Suwon-si, Gyeonggi-do (KR)

(72) Inventors: Kwang-Hyun Baek, Anseong-si (KR); Won-Bin Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 382 days.

(21) Appl. No.: 15/146,370

(22) Filed: May 4, 2016

(65) Prior Publication Data

US 2016/0336646 A1  Nov. 17, 2016

(30) Foreign Application Priority Data

May 11, 2015 (KR) .......................... 10-2015-0065459

(51) Int. Cl.
*H01Q 1/24* (2006.01)
*H01Q 1/22* (2006.01)
*H01Q 1/02* (2006.01)

(52) U.S. Cl.
CPC ........... *H01Q 1/2283* (2013.01); *H01Q 1/243* (2013.01); *H01Q 1/02* (2013.01)

(58) Field of Classification Search
CPC .................................................. H01Q 1/2283
See application file for complete search history.

(56) References Cited

U.S. PATENT DOCUMENTS

| 7,830,312 B2* | 11/2010 | Choudhury ............. H01Q 3/26 |
| | | 343/700 MS |
| 9,806,422 B2* | 10/2017 | Garcia ................. H01Q 9/0407 |
| 2011/0088936 A1 | 4/2011 | Schaaf et al. |
| 2012/0235881 A1 | 9/2012 | Pan et al. |
| 2013/0207274 A1 | 8/2013 | Liu et al. |
| 2013/0256850 A1 | 10/2013 | Danny et al. |
| 2013/0328739 A1 | 12/2013 | Rofougaran et al. |
| 2014/0035097 A1 | 2/2014 | Lin et al. |

(Continued)

FOREIGN PATENT DOCUMENTS

| JP | 9-199526 A | 7/1997 |
| WO | 2015-0414422 A1 | 3/2015 |

OTHER PUBLICATIONS

Sanming Hu et al.; "TSV Technology for Millimeter-Wave and Terahertz Design and Applications"; XP011351130; Feb. 2, 2011.

(Continued)

*Primary Examiner* — Jessica Han
*Assistant Examiner* — Amal Patel
(74) *Attorney, Agent, or Firm* — Jefferson IP Law, LLP

(57) ABSTRACT

An antenna device and an electronic device including the antenna device are provided. The antenna device includes a radio frequency (RF) module and a baseband (BB) module. The RF module includes first radiating conductors and a radio frequency integrated chip (RFIC) integrated with the first radiating conductors. The BB module includes second radiating conductors respectively corresponding to some of the first radiating conductors and a baseband integrated chip (BBIC) integrated with the second radiating conductors. The RF module may be combined with the BB module via a cable or be positioned facing the BB module to be electrically connected with the BB module.

21 Claims, 6 Drawing Sheets

(56) References Cited

U.S. PATENT DOCUMENTS

| | | |
|---|---|---|
| 2014/0145883 A1 | 5/2014 | Baks et al. |
| 2014/0253382 A1 | 9/2014 | Markish et al. |
| 2015/0009081 A1 | 1/2015 | Hulsmann et al. |
| 2015/0070228 A1 | 3/2015 | Gu et al. |
| 2015/0084194 A1 | 3/2015 | Molzer et al. |
| 2016/0211586 A1 | 7/2016 | Hong et al. |

OTHER PUBLICATIONS

Wonbin Hong et al. "Multilayer Antenna Package for IEEE 802.11ad Employing Ultralow-Cost FR4"; XP011474845, Dec. 12, 2012.

Onofrio Losito et al.; "X-Band SIW Cavity-Backes Patch Antenna for Radar Applications"; XP032535634.

Kyutae Lim et al.; "Development of Planar Antennas in Multi Packages for RF-System-on-a-Package Applications"; XP055462340.

\* cited by examiner

ANTENNA DEVICE AND ELECTRONIC DEVICE INCLUDING THE SAME

CROSS-REFERENCE TO RELATED APPLICATION(S)

This application claims the benefit under 35 U.S.C. § 119(a) of a Korean patent application filed on May 11, 2015 in the Korean Intellectual Property Office and assigned Serial number 10-2015-0065459, the entire disclosure of which is hereby incorporated by reference.

TECHNICAL FIELD

The present disclosure relates to electronic devices. More particularly, the present disclosure relates to an antenna device for communicating wireless signals and an electronic device having the antenna device.

BACKGROUND

Wireless communication techniques are implemented in various ways, such as wireless local area network (WLAN) represented by Wi-Fi, Bluetooth, and near field communication (NFC), as well as by commercialized mobile communication network access technologies. Mobile communication services, starting with 1st-generation, voice-centered mobile communication services, are evolving to high-speed, high-capacity services (e.g., high-quality video streaming services). The wireless gigabit alliance (WiGig) or other future commercially available next-generation mobile communication services are predicted to be served through ultra-high-frequency bands of a few tens of GHz.

As communication standards such as WLAN or Bluetooth are widely used, electronic devices (e.g., mobile communication terminals), come with antenna devices that operate in various frequency bandwidths. For example, the fourth generation mobile communication service is operated in a frequency bandwidth of 700 MHz, 1.8 GHz, or 2.1 GHz. Wi-Fi is operated in a frequency bandwidth of 2.4 GHz or 5 GHz, and Bluetooth is operated in a frequency bandwidth of 2.45 GHz, although slightly varied depending on their protocols.

The provision of quality-stabilized services over a commercially available wireless communication network need meet a high antenna device gain and a broad beam coverage area. The next-generation mobile communication service is provided through an ultra-high-frequency bandwidth of a few tens of GHz (e.g., a frequency band within a range of 30 GHz to 300 GHz and with a resonant frequency wavelength of about 1 mm to 10 mm) and may thus require higher performance than the antenna device used in the legacy commercial mobile communication service presents.

The antenna device used on a band of a few tens of GHz (hereinafter, referred to as mmWave communication) has a resonant frequency wavelength merely reaching 1 mm to 10 mm, and the emitter may further shrink. In order to prevent transmission loss that occurs between the communication circuit and the emitter, the antenna device used for mmWave communication may have the emitter disposed adjacent to a radio frequency integrated circuit chip (RFIC) equipped with a transceiver circuit unit to implement a radio frequency (RF) module. The RF module may perform communication of wireless signals and digital signal conversion with wireless signals, and a baseband (BB) module or digital module connected with the RF module may process communicated data.

A currently available communication scheme may adopt integrated modules in which the RF module and the BB module are integrated (stacked) together. By contrast, configuring an integrated module of the BB module and the RF module having the emitter disposed therein may lead to increased attenuation of highly straight wireless signals in the mmWave communication scheme. For example, the BB module may put obstacles in communication of wireless signals.

Further, the RF module (e.g., an RF circuit chip), used in the mmWave communication scheme, as compared with communication schemes, such as $3^{rd}$ generation (3G), $4^{th}$ generation (4G), Wi-Fi, or Bluetooth, may generate a considerable amount of heat, and thus, an implementation of such an integrated module may require a heat-radiating structure. A home appliance such as a television may have space for installation of an integrated module with such heat-radiating structure, but it is not easy to equip an integrated module used in the mmWave communication scheme in a mobile device or other compact electronic devices.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a compact antenna device having a baseband (BB) module integrated with a radio frequency (RF) module used in the mmWave communication scheme and an electronic device including the antenna device.

Another aspect of the present disclosure is to provide an antenna device that may secure a heat-radiating capability even without a separate heat-radiating member and thus perform stabilized operations and an electronic device including the antenna device.

Another aspect of the present disclosure is to provide an antenna device that may selectively implement integration or separation of the RF module and the BB module even without a separate design change considering the space for installation in the electronic device.

In accordance with an aspect of the present disclosure, an antenna device and electronic device including the antenna device are provided. The antenna device includes an RF module including a plurality of first radiating conductors and an RF integrated chip (RFIC) integrated with the first radiating conductors and a BB module including second radiating conductors respectively corresponding to some of the first radiating conductors and a baseband integrated chip (BBIC) integrated with the second radiating conductors, wherein the RF module may be combined with the BB module via a cable or to be positioned facing the BB module to be electrically connected with the BB module.

While the RF module is combined with the BB module to be positioned facing the BB module, some of the first radiating conductors may be provided as soldering members to provide electricity to their respective second radiating conductors.

According to an embodiment of the present disclosure, the BB module and the RF module used in the mmWave communication scheme may be integrated together, and the heat-radiating capability may be enhanced by via holes (e.g., a via hole for power supply or via hole for ground) arranged in the RF module or the BB module. For example, without the need for a separate heat-radiating structure may allow the antenna device to be made compact while allowing the antenna device to be easily mounted in a compact electronic device (e.g., a mobile communication terminal). Further, the RF module and the BB module themselves have enhanced heat-radiating capability, and despite long-term use, the antenna device may remain stable in operation. Further, a distortion of heat-radiating capability that may arise due to the integration of the RF module into the BB module may be compensated by the heat-radiating conductor disposed in the BB module, leading to a stabilized radiating capability. Further, the RF module may be installed independently or integrated with the BB module depending on the space for installation in the electronic device. For example, according to an embodiment of the present disclosure, the antenna device may secure an installation structure appropriate for the space in the electronic device while maintaining the heat-radiating capability even without a separate design change.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
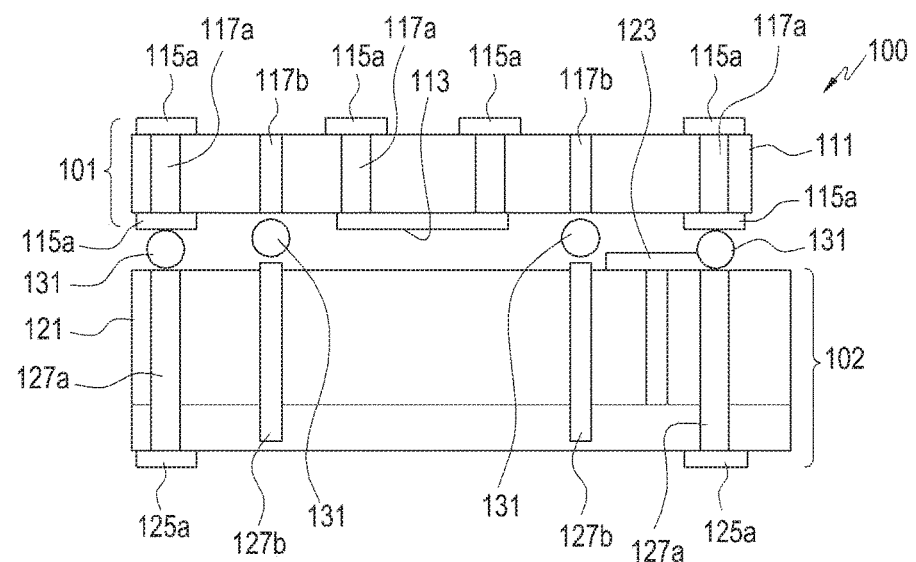
FIG. 1 is a cross-sectional view illustrating an antenna device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the terms "A or B," "at least one of A and/or B," or "one or more of A and/or B" may include all possible combinations of A and B. For example, "A or B," "at least one of A and B," "at least one of A or B" may indicate all of (1) including at least one A, (2) including at least one B, or (3) including at least one A and at least one B.

As used herein, the terms "first" and "second" may modify various components regardless of importance and/or order and are used to distinguish a component from another without limiting the components. For example, a first user device and a second user device may indicate different user devices from each other regardless of the order or importance of the devices. For example, a first component may be denoted a second component, and vice versa without departing from the scope of the present disclosure.

It will be understood that when an element (e.g., a first element) is referred to as being (operatively or communicatively) "coupled with/to," or "connected with/to" another element (e.g., a second element), it can be coupled or connected with/to the other element directly or via a third element. In contrast, it will be understood that when an element (e.g., a first element) is referred to as being "directly coupled with/to" or "directly connected with/to" another element (e.g., a second element), no other element (e.g., a third element) intervenes between the element and the other element.

As used herein, the terms "configured (or set) to" may be interchangeably used with the terms "suitable for," "having the capacity to," "designed to," "adapted to," "made to," or "capable of" depending on circumstances. The term "configured (or set) to" does not essentially mean "specifically designed in hardware to." Rather, the term "configured to" may mean that a device can perform an operation together with another device or parts. For example, the term "processor configured (or set) to perform A, B, and C" may mean a generic-purpose processor (e.g., a central processing unit (CPU) or application processor (AP)) that may perform the operations by executing one or more software programs stored in a memory device or a dedicated processor (e.g., an embedded processor) for performing the operations.

It will be further understood that the terms "comprise" and/or "have," when used in this specification, specify the presence of stated features, integers, operations, elements, and/or components, but do not preclude the presence or addition of one or more other features, integers, operations, elements, components, and/or groups thereof.

Unless otherwise defined, all terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

As used herein, the term "electronic device" may be any device with an antenna device, and the electronic device may also be referred to as a terminal, a portable terminal, a mobile terminal, a communication terminal, a portable communication terminal, a portable mobile terminal, or a display apparatus.

For example, the electronic device may be a smartphone, a mobile phone, a navigation device, a game device, a television (TV), a head unit for vehicles, a laptop computer, a tablet computer, a personal media player (PMP), or a personal digital assistant (PDA). The electronic device may be implemented as a pocket-sized portable communication terminal with a radio communication function. According to an embodiment of the present disclosure, the electronic device may be a flexible device or a flexible display.

The electronic device may communicate with an external electronic device (e.g., a server), or may perform tasks by interworking with such an external electronic device. For example, the electronic device may transmit an image captured by a camera and/or location information detected by a sensor to a server through a network. The network may include, but is not limited to, a mobile or cellular communication network, a local area network (LAN), a wireless LAN (WLAN), a wide area network (WAN), the Internet, or a small area network (SAN).

Figure 2:
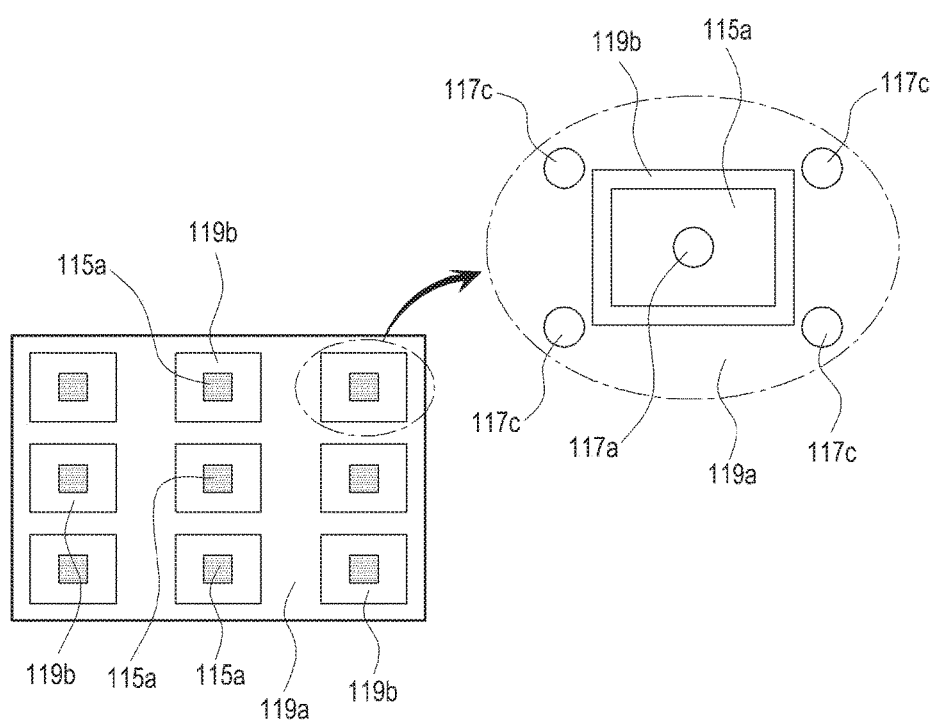
FIG. 2 is a view illustrating an example of a structure of a radiating conductor in an antenna device according to an embodiment of the present disclosure.

FIG. 1 is a cross-sectional view illustrating an antenna device according to an embodiment of the present disclosure. FIG. 2 is a view illustrating an example of a structure of a radiating conductor in an antenna device according to an embodiment of the present disclosure.

Referring to FIGS. 1 and 2, the antenna device 100 configures an integrated module of a radio frequency (RF) module 101 and a baseband (BB) module 102. The RF module 101 may be combined with the BB module 102 to be stacked on the BB module 102.

The RF module 101 may have an RF circuit chip (or also referred to as an RF integrated chip (RFIC)) 113 on a surface of a first circuit board 111 and may have first radiating conductors 115a on a surface and/or opposite surface thereof. The arrangement of the RF circuit chip 113 and the first radiating conductors 115a may be structured to prevent transmission loss between the RF circuit chip 113 and the first radiating conductors 115a. The first radiating conductors 115a mounted in the RF module 101 may be utilized in an mmWave communication scheme requiring high capability. For example, the RF module 101 may have a thickness of a few mm and an area within 90 mm$^2$.

The RF circuit chip 113 may include a transceiver, a power amplifier module (PAM), a frequency filter, or a low noise amplifier (LN). The RF circuit chip 113 may convert a digital signal (e.g., a BB signal) into an analog signal (e.g., an RF signal) and supply the converted signal to the first radiating conductors 115a, and the RF circuit chip 113 may convert an analog signal (e.g., an RF signal) into a digital signal (e.g., a BB signal) and supply the converted signal to the BB module 102.

Figure 3:
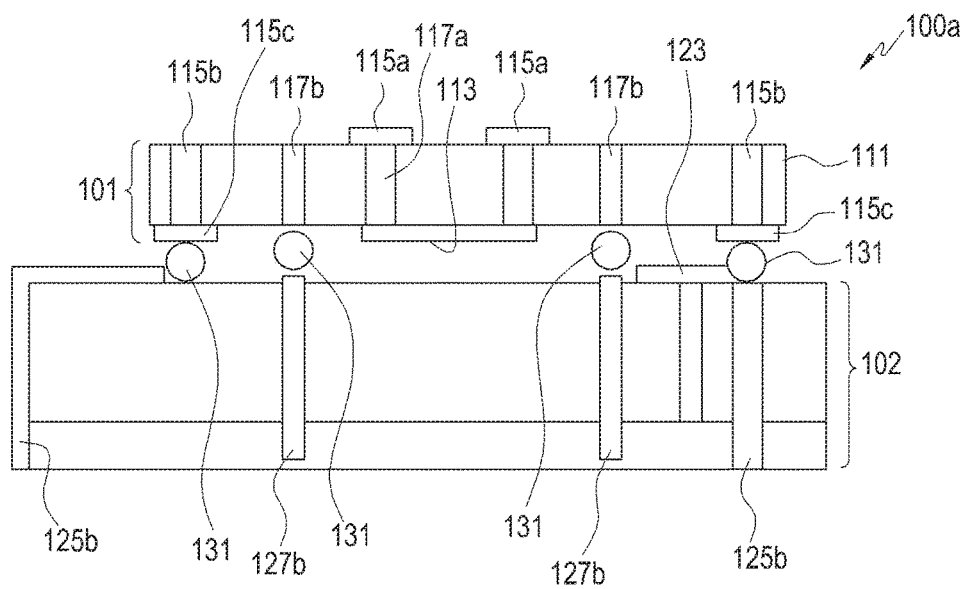
FIG. 3 is a cross-sectional view illustrating an antenna device according to an embodiment of the present disclosure.
Figure 4:
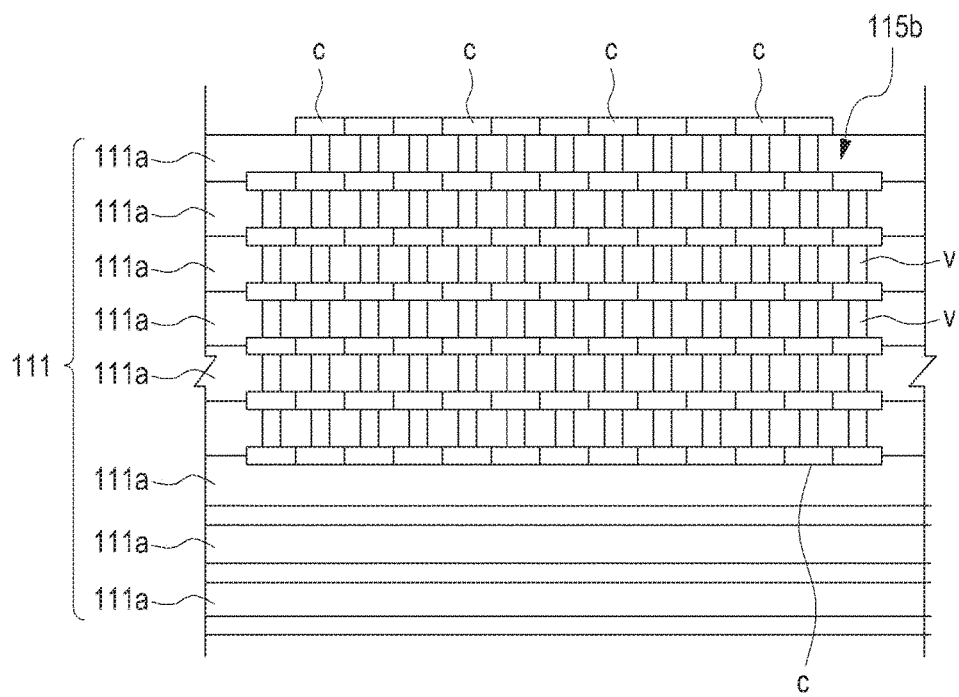
FIG. 4 is a view illustrating an example of a structure of a radiating conductor in an antenna device according to an embodiment of the present disclosure.

The first radiating conductors 115a may be arranged on a surface and/or opposite surface of the first circuit board 111 to form broadside radiation. As described below, other first radiating conductors 115b (as shown in FIGS. 3 and 4) may be arranged on the first circuit board 111 to form endfire radiation. As such, the first radiating conductors 115a and 115b arranged on the first circuit board 111 may form broadside radiation or endfire radiation depending on their structure or position, allowing the antenna device 100 to have omnidirectional characteristics.

The first radiating conductors 115a arranged on a surface of the first circuit board 111, e.g., a surface facing the BB module 102 when the RF module 101 is stacked on the BB module 102, may be arranged to be surrounded by a ground area. For example, a conductive layer 119a may be formed on a surface of the first circuit board 111 to provide a ground. Slots 119b may be formed in the conductive layer 119a. The first radiating conductors 115a may be arranged in the slots 119b, respectively, to be surrounded by the ground area. Here, an interval between the ground area provided by the conductive layer 119a and the first radiating conductors 115a may be smaller than a ground-signal-ground (GSG) pitch.

The first radiating conductors 115a, respectively, may receive electricity through via holes 117a for power supply (hereinafter, "first via holes") or a printed circuit pattern (not shown) from the RF circuit chip 113. In order to prevent transmission loss of power-supply signals provided to the first radiating conductors 115a, a plurality of via holes 117c for ground (hereinafter, "second via holes") may be arranged around the first via holes 117a. The respective ends of the second via holes 117c may be connected with the conductive layer 119a. The number and position of arrangement of the second via holes 117c may vary depending on requirements for the antenna device 100. When the second via holes 117c are provided in an even number, they may be arranged symmetrical with respect to the first via holes 117a, and when the second via holes 117c are provided in an odd number, they may be arranged at equal angles along the circumference of the first via holes 117a around the first via holes 117a.

The BB module 102 may include a module for the mmWave communication scheme (e.g., the wireless gigabit alliance (WiGig) module). The BB module 102 may include a processor for processing data communicated through the RF module 101 (e.g., BB integrated chip 123). The BB module 102 may be implemented on a second circuit board 121 having a thickness of a few mm or less and an area of 120 mm$^2$ or less. The BB integrated chip 123 may be mounted on the second circuit board 121, and second radiating conductors 125a may be arranged on a surface or opposite surface thereof.

The second radiating conductors 125a, respectively, may be arranged corresponding to some of the first radiating conductors 115a. For example, when the RF module 101 is stacked on the BB module 102, broadside radiation formed by some of the first radiating conductors 115a arranged to face the BB module 102 when the RF module 101 is stacked on the BB module 102 (e.g., the first radiating conductors 115a arranged on the bottom surface of the first circuit board 111 as shown in FIG. 1) may be attenuated by the BB module 102. Some of the first radiating conductors 115a experiencing a deterioration of capability due to interference by the BB module 102 may be connected with the second radiating conductors 125a, respectively, supplying electricity to the second radiating conductors 125a. For example, in stacking or integrating the RF module 101 with the BB module 102, some of the first radiating conductors 115a may be used as a soldering pad for coupling the RF module 101 with the BB module 102 and may transfer power-supply signals provided to the first radiating conductors 115a to the second radiating conductors 125a. The second radiating conductor(s) 125a may receive electricity through the first radiating conductors 115a used as the soldering pad to form broadside radiation. Therefore, according to an embodiment of the present disclosure, the antenna device 100 may have the RF module 101 and the BB module 102 integrated together while preventing a deterioration of radiation capability in the mmWave communication scheme.

The BB module 102 may further include via holes 127a for power supply to transfer power supply signals to the second radiating conductors 125a and via holes (not shown) for ground disposed around the via hole for power supply. For example, the first radiating conductors 115a used as the soldering pad may transfer power supply signals to the second radiating conductors 125a through the via holes 127a for power supply formed in the second circuit board 121. The via holes for ground may be positioned around the via holes 127a for power supply, preventing transmission loss of power supply signals. The arrangement of the second radiating conductors 125a and the structure providing power supply and ground through the via holes may be implemented similar to the arranged structure of the first radiating conductors 115a described above in connection with FIG. 2. For example, a conductive layer and slots may be formed in the bottom surface of the second circuit board 121, and the second radiating conductors 125a may be arranged in the slots. The conductive layers respectively formed on the first and second circuit boards 111 and 121 may be connected with each other via the ground via holes arranged around the power supply via holes 127a or the ground via holes 127b formed in the BB module 102. Further, when areas providing an additional ground other than the conductive layer 119a is provided to the RF module 101 and the BB module 102, respectively, additional via holes (e.g., the via holes 117b) may be provided to connect the areas with each other.

As described above, when the RF module 101 is coupled with the BB module 102, multiple solder balls 131 may come in use. For example, the power supply via hole 127a connected with the second radiating conductor 125a may be connected to the first radiating conductor 115a used as a soldering pad through one of the solder balls 131. When additional ground via holes 117b and 127b connecting the respective ground areas of the RF module 101 and the BB module 102 are arranged to correspond to each other, one of the solder balls 131 may be disposed between the ground via holes 117b and 127b, providing an electrical connection structure while coupling the RF module 101 and the BB module 102 together.

In the structure of the antenna device, relatively more heat may be generated from the RF module (e.g., the RF circuit chip). The heat generated from the RF module in a continuous communication operation may deteriorate the capability of communicating wireless signals. According to an embodiment of the present disclosure, the antenna device 100 may disperse the heat generated from the RF module 101 through the first and second via holes 117a and 117c and through the above-described via holes 117b and 127b. For example, the heat generated from the RF module 101 may be prevented from concentrating on the RF circuit chip 113. Therefore, even without placing a separate heat-radiating structure in the antenna device 100, the RF module 101 may maintain stable operational capability.

Further, no need for a separate heat-radiating structure may allow for a compact size and integration of the RF module 101 and the BB module 102. Accordingly, according to an embodiment of the present disclosure, the antenna device 100 may be equipped in a compact electronic device, such as a mobile communication terminal, as well as a large-size electronic device, such as a home appliance. Further, the RF module 101, while not integrated with the BB module 102, may exert its designed radiation capability, and thus, the RF module 101 and the BB module 102 may be arranged separately or integrated with each other to fit the installation environment in the electronic device.

FIG. 3 is a cross-sectional view illustrating an antenna device 100a according to an embodiment of the present disclosure. FIG. 4 is a view illustrating an example of a structure of a radiating conductor in an antenna device 100a according to an embodiment of the present disclosure.

According to the above-described embodiment of the present disclosure, there is disclosed an example of an antenna device in which the first radiating conductors equipped in the RF module form broadside radiation. According to the instant embodiment of the present disclosure, there is disclosed an example of an antenna device in which the first radiating conductors equipped in the RF module form endfire radiation. However, it is noted that the present disclosure is not limited to such embodiments of the present disclosure. For example, the first radiating conductors included in the antenna device according to the above embodiment and the first radiating conductors included in the antenna device according to the instant embodiment may be equipped in a single RF module. Indeed, in an antenna device designed and manufactured by Applicant, e.g., the antenna device for the mmWave communication scheme, some of the first radiating conductors arranged in the RF module may form broadside radiation while the others form endfire radiation, thereby implementing omni-directional characteristics.

It is noted that in describing various embodiments the components easy to understand from the description of the above embodiment are denoted with the same reference numerals or omitted, and their detailed description may be skipped.

Referring to FIGS. 3 and 4, the antenna device 100a may include an RF module 101 and a BB module 102. The RF module 101 may be installed while separated from the BB module 102. Referring to FIG. 3, the RF module 101 may be integrated with the BB module 102 while stacked on the BB module 102.

The RF module 101 may include first radiating conductors 115b inside or partially exposed to the outside of the first circuit board 111. For example, the first radiating conductors 115b may be arranged inside the first circuit board 111 to be exposed to a side surface of the first circuit board 111 or positioned parallel with the side surface thereof.

The first circuit board 111 may include multiple layers 111a, conductors c, and via holes v. The conductors c may be arranged on at least one of a surface and opposite surface of each layer 111a, and the conductors c respectively arranged on different layers 111a may be connected together via the via holes v. For example, the via holes v may be formed through the layers 111a to connect the conductors c arranged on different surfaces, thereby forming a mesh grid structure. At least one of the first radiating conductors 115b may be implemented by the conductors c and the via holes v forming the mesh grid structure. The first radiating conductors 115b may receive power supply signals from an RF circuit chip 113 through printed circuit patterns formed on the first circuit board 111 to form endfire radiation.

Similar to the above embodiment of the present disclosure, the antenna device 100a may include other first radiating conductors 115a arranged on a surface and/or opposite surface of the first circuit board 111. The first radiating conductors 115a arranged on a surface and/or opposite surface of the first circuit board 111 may receive electricity from the RF circuit chip 113 to form broadside radiation. As such, the RF module 101 may form a radiation pattern with omni-directional characteristics through combinations of the first radiating conductors 115a forming broadside radiation and the second radiating conductors 115b forming endfire radiation.

The BB module 102 may include second radiating conductors 125b arranged on a side surface, e.g., a side surface of the second circuit board 121, or arranged parallel with the side surface. The second radiating conductors 125b may be arranged corresponding to some of the first radiating conductors 115b. At least one of the second radiating conductors 125b may be formed in a mesh grid structure as shown in FIG. 4. When the RF module 101 is installed while separated from the BB module 102, the RF module 101 itself may form a radiation pattern with omni-directional characteristics. When the RF module 101 is installed while stacked on the BB module 102, the second radiating conductors 125b may be connected with the first radiating conductors 115b, respectively. For example, soldering pads 115c connected with the first radiating conductors 115b may be provided on the bottom surface of the first circuit board 111, and the second radiating conductors 125b may be connected with the first radiating conductors 115b, respectively, through the solder balls 131 and the soldering pads 115c. When connected to the second radiating conductors 125b, the first radiating conductor(s) 115b may transfer power supply signals provided from the RF circuit chip 113 to the second radiating conductors 125b through the soldering pads 115c and the solder balls 131. The second radiating conductors 125b may receive power supply signals through the first radiating conductors 115b to form endfire radiation.

The BB module 102, as mentioned above, may be larger in area than the RF module 101. Accordingly, in such a state where the RF module 101 is stacked on the BB module 102, the BB module 102, e.g., the second circuit board 121, may distort the endfire radiation of the first radiating conductors 115b, at least partially at a lower side of the first radiating conductors 115b. Here, regarding the endfire radiation formed by the second radiating conductors 125b, the antenna device 100a may secure a radiation capability fitting for the design specifications of the RF module 101 by compensating for the endfire radiation of the first radiating conductors 115b distorted by the BB module 102.

Although not specifically mentioned in connection with the instant embodiment of the present disclosure, the antenna device 100a may also include via holes for power supply or ground and may provide a heat radiating structure for the RF circuit chip 113 through the via holes. This eliminates the need for installing a separate heat radiating structure, providing for more compactness.

According to the above-described embodiments of the present disclosure, the antenna devices 100 and 100a may have a structure that is easy to make compact while allowing for integration of the RF module and BB module even in the mmWave communication scheme (e.g., WiGig). According to an embodiment of the present disclosure, the antenna device may be utilized for mmWave communication or Wi-Fi communication. For example, according to an embodiment of the present disclosure, the antenna device may be configured through one of the above-described second radiating conductors to be suitable for the resonant frequency adopted for Wi-Fi communication, allowing itself to be utilized for both mmWave communication and Wi-Fi communication. Such a structure is described below with reference to FIG. 5.

Figure 5:
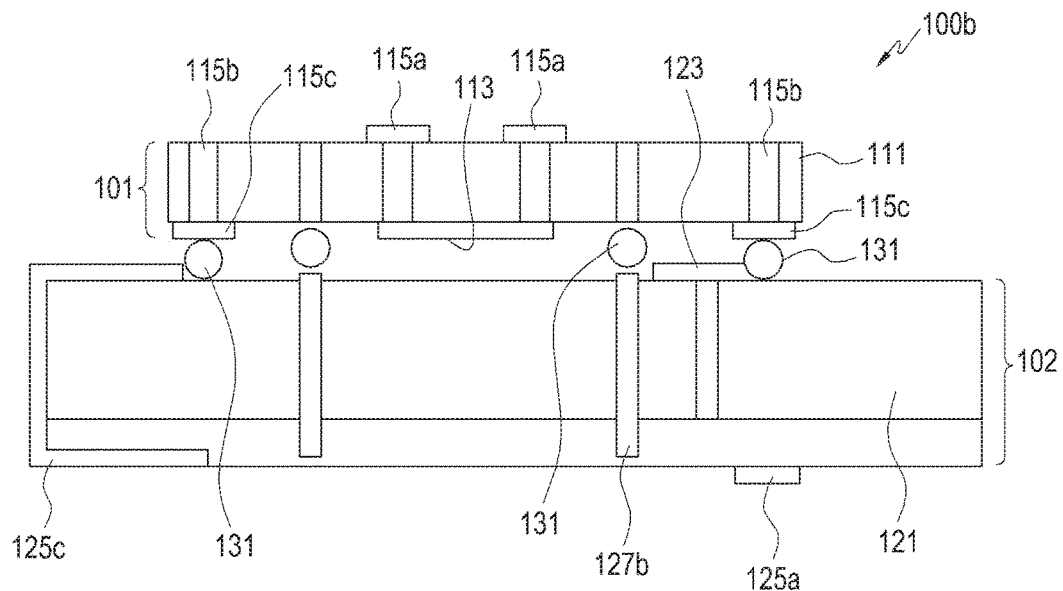
FIG. 5 is a cross-sectional view illustrating an antenna device according to an embodiment of the present disclosure.

FIG. 5 is a cross-sectional view illustrating an antenna device 100b according to an embodiment of the present disclosure.

Referring to FIG. 5, a third radiating conductor 125c may have an electrical length larger than the second radiating conductor 125a. For example, the third radiating conductor 125c may be connected to the first radiating conductor 115b through the solder ball 131 and the soldering pad 115c on a surface of the second circuit board 121 and may have a structure extending beyond a side surface of the second circuit board 121 to an opposite surface of the second circuit board 121. However, the present disclosure is not limited thereto. As long as an electrical length and radiation capability forming a resonant frequency different from that by the first radiating conductors 115a and 115b may be secured, the position and shape of the third radiating conductor 125c on the second circuit board 121 may be varied. For example, when the first radiating conductors 115a and 115b form a resonant frequency for mmWave communication, the third radiating conductor 125c may form a resonant frequency for Wi-Fi communication.

The third radiating conductor 125c, even when receiving electricity through the first radiating conductors 115b, may form a resonant frequency in different frequency bands depending on the electrical length. When the third radiating conductor 125c forms a resonant frequency in a frequency band different from that of the first radiating conductor 115b, the antenna device 100b may further include an impedance matching circuit for a stable operation of the third radiating conductor 125c.

Figure 6:
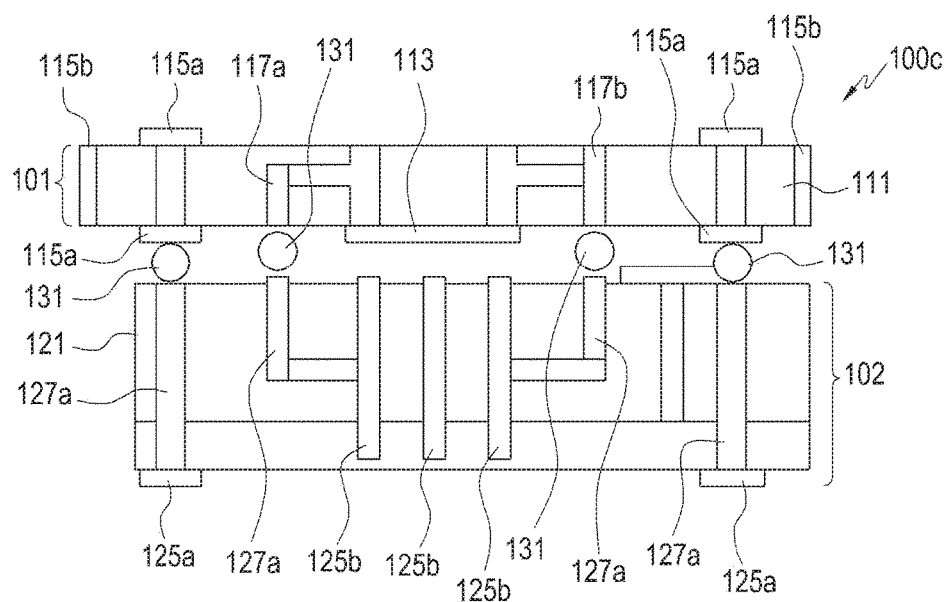
FIG. 6 is a cross-sectional view illustrating an antenna device according to an embodiment of the present disclosure.

FIG. 6 is a cross-sectional view illustrating an antenna device 100c according to an embodiment of the present disclosure.

Referring to FIG. 6, according to the instant embodiment of the present disclosure, the antenna device 100c may have a structure in which second radiating conductor(s) 125a for forming broadside radiation and other second radiating conductor(s) 125b for forming endfire radiation are arranged on the second circuit board 121 of the BB module 102. The respective ends of the second radiating conductors 125b for forming broadside radiation may be positioned adjacent to the RF circuit chip 113 while the RF module 101 is stacked on the BB module 102. For example, the second radiating conductors 125b may be formed of a combination of via holes or the above-described mesh grind structure, and as they are positioned adjacent to the RF circuit chip 113, they may transfer or disperse heat generated from the RF circuit chip 113.

The second radiating conductor(s) 125b forming endfire radiation may directly receive electricity from the RF circuit chip 113 through the power supply via holes 117a and 127a respectively formed in the first and second circuit boards 111 and 121 or the printed circuit patterns. According to an embodiment of the present disclosure, the second radiating conductor(s) 125a for forming broadside radiation may also receive electricity through soldering pads or the first radiating conductors 115a used as soldering pads.

As such, according to an embodiment of the present disclosure, the antenna devices 100, 100a, 100b, and 100c may compensate for distorted capability of the radiating conductors 115a and 115b arranged in the RF module 101 through the radiating conductors 125a and 125b arranged in the BB module 102 even when the RF module 101 is integrated with the BB module 102. Further, the via holes or mesh grid-structure radiating conductors formed in the RF module 101 and the BB module 102 may dissipate heat generated from the RF circuit chip 113, allowing the antenna devices 100, 100a, 100b, and 100c to maintain stabilized operational capability. Further, the need for placing a separate heat radiating structure is eliminated, and compactness may be achieved, contributing to an implementation of a slim and compact electronic device. Further, the RF module 101 may be installed in the electronic device without being integrated with the BB module 102, allowing it to be installed to fit the arrangement in space in the electronic device even without a separate design change.

Figure 7:
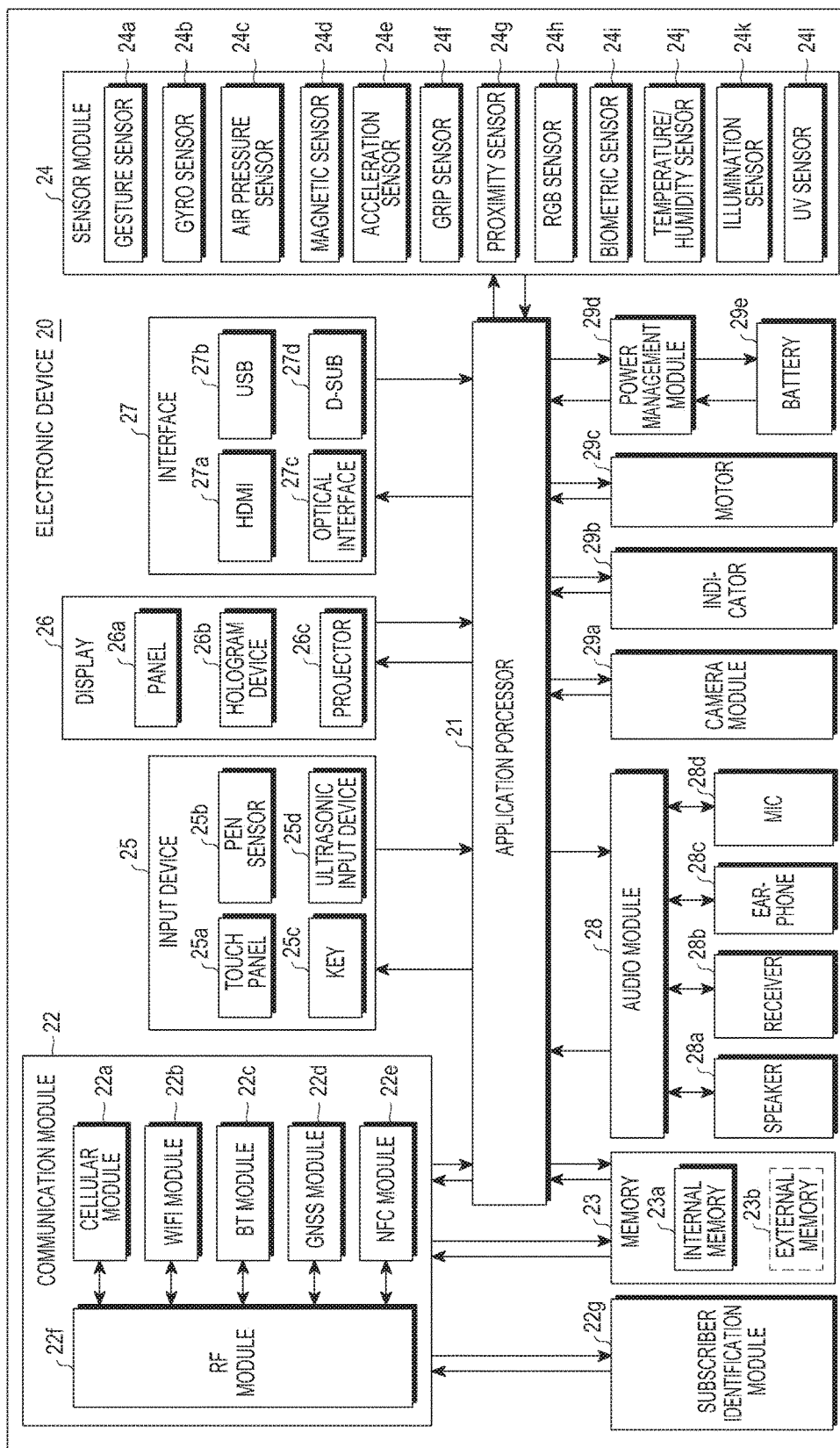
FIG. 7 is a block diagram illustrating a configuration of an electronic device including an antenna device according to an embodiment of the present disclosure.

FIG. 7 is a block diagram illustrating a configuration of an electronic device 20 including an antenna device according to an embodiment of the present disclosure.

Referring to FIG. 7, the electronic device 20 may include one or more processors (e.g., application processors (APs)) 21, a communication module 22, a subscriber identification module (SIM) 22g, a memory 23, a sensor module 24, an input device 25, a display 26, an interface 27, an audio module 28, a camera module 29a, a power management module 29d, a battery 29e, an indicator 29b, and a motor 29c.

The processor 21 may control multiple hardware and software components connected to the processor 21 by running an operating system or application programs, and the processor 210 may process and compute various data. For example, the processor 21 may be implemented in a system on chip (SoC). According to an embodiment of the present disclosure, the processor 21 may further include a graphics processing unit (GPU) and/or an image signal processor (ISP). The processor 21 may control at least some (e.g., the cellular module 22a) of the components shown in FIG. 7. The processor 21 may load a command or data received from at least one of other components (e.g., a non-volatile memory) on a volatile memory, process the command or data, and store various data in the non-volatile memory.

The communication module 22 may include a cellular module 22a, a Wi-Fi module 22b, a Bluetooth (BT) module 22c, a global navigation satellite system (GNSS) module 22d (e.g., a global positioning system (GPS) module, a GLONASS module, a BeiDou module, or a Galileo module), a near field communication (NFC) module 22e, and an RF module 22f. The above-described BB module 102 may be the whole or part of the cellular module 22a, as enumerated above, or the BB module 102 may include a WiGig module.

The cellular module 22a may provide voice call, video call, text, or Internet services through a communication network. According to an embodiment of the present disclosure, the cellular module 22a may perform identification or authentication on the electronic device 20 in the communication network using a SIM 22g (e.g., the SIM card). According to an embodiment of the present disclosure, the cellular module 22a may perform at least some of the functions providable by the processor 21. According to an embodiment of the present disclosure, the cellular module 22a may include a communication processor (CP).

The Wi-Fi module 22b, the Bluetooth module 22c, the GNSS module 22d, or the NFC module 22e may include a process for processing data communicated through the module. At least some (e.g., two or more) of the cellular module 22a, the Wi-Fi module 22b, the Bluetooth module 22c, the GNSS module 22d, or the NFC module 22e may be included in a single integrated circuit (IC) or an IC package.

The RF module 22f may configure the whole or part of the above-described RF module 101, and the RF module 22f may communicate data via communication signals (e.g., RF signals). The RF module 22f may include a transceiver, a PAM, a frequency filter, an LNA, or an antenna (e.g., the above-described first and second radiating conductors 115a, 115b, 125a, and 125b). According to an embodiment of the present disclosure, at least one of the cellular module 22a, the Wi-Fi module 22b, the Bluetooth module 22c, the GNSS module 22d, or the NFC module 22e may communicate RF signals through a separate RF module.

The SIM 22g may include a card including a SIM and/or an embedded SIM, and may contain unique identification information (e.g., an IC card identifier (ICCID) or subscriber information (e.g., an international mobile subscriber identity (IMSI)).

The memory 23 may include an internal memory 23a or an external memory 23b. The internal memory 23a may include at least one of a volatile memory (e.g., a dynamic random access memory (DRAM), a static RAM (SRAM), a synchronous dynamic RAM (SDRAM), etc.) or a non-volatile memory (e.g., a one time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash, or a NOR flash), a hard drive, or solid state drive (SSD).

The external memory 23b may include a flash drive (e.g., a compact flash (CF) memory), a secure digital (SD) memory, a micro-SD memory, a mini-SD memory, an extreme digital (xD) memory, a multi-media card (MMC), or a Memory Stick™. The external memory 23b may be functionally and/or physically connected with the electronic device 20 via various interfaces.

For example, the sensor module 24 may measure a physical quantity or detect an operational state of the electronic device 20, and the sensor module 24 may convert the measured or detected information into an electrical signal. The sensor module 24 may include at least one of a gesture sensor 24a, a gyro sensor 24b, an atmospheric or air pressure sensor 24c, a magnetic sensor 24d, an acceleration sensor 24e, a grip sensor 24f, a proximity sensor 24g, a color or red-green-blue (RGB) sensor 24h, a biometric sensor 24i, a temperature/humidity sensor 24j, an illumination sensor 24k, or an ultra violet (UV) sensor 24l. Additionally or alternatively, the sensing module 24 may include an E-nose sensor, an electromyography (EMG) sensor, an electroencephalogram (EEG) sensor, an electrocardiogram (ECG) sensor, an infrared (IR) sensor, an iris sensor, or a finger print sensor. The sensor module 24 may further include a control circuit for controlling at least one or more of the sensors included in the sensing module. According to an embodiment of the present disclosure, the electronic device 20 may further include a processor configured to control the sensor module 24 as part of the processor 21 or separately from the processor 21, and the electronic device 20 may control the sensor module 24 while the processor 21 is in a sleep mode.

The input unit 25 may include a touch panel 25a, a (digital) pen sensor 25b, a key 25c, or an ultrasonic input device 25d. The touch panel 25a may use at least one of capacitive, resistive, IR, or ultrasonic methods. The touch panel 25a may further include a control circuit. The touch panel 25a may further include a tactile layer and may provide a user with a tactile reaction.

The (digital) pen sensor 25b may include a part of a touch panel or a separate sheet for recognition. The key 25c may include a physical button, optical key or key pad. The ultrasonic input device 25d may sense an ultrasonic wave generated from an input tool through a microphone (e.g., the microphone 28d) to identify data corresponding to the sensed ultrasonic wave.

The display 26 may include a panel 26a, a hologram device 26b, or a projector 26c. The panel 26a may be implemented to be flexible, transparent, or wearable. The panel 26a, together with the touch panel 25a, may be configured in a single module. The hologram device 26b may make three dimensional (3D) images (holograms) in the air by using light interference. The projector 26c may display an image by projecting light onto a screen. The screen may be, for example, located inside or outside of the electronic device 20. In accordance with an embodiment, the display 26 may further include a control circuit to control the panel 26a, the hologram device 26b, or the projector 26c.

The interface 27 may include a high definition multimedia interface (HDMI) 27a, a universal serial bus (USB) 27b, an optical interface 27c, or a D-subminiature (D-sub) 27d. Additionally or alternatively, the interface 27 may include a mobile high-definition link (MHL) interface, an SD card/MMC interface, or infrared data association (IrDA) standard interface.

The audio module 28 may convert a sound signal into an electrical signal and vice versa. The audio module 28 may process sound information input or output through a speaker 28a, a receiver 28b, an earphone 28c, or a microphone (MIC) 28d.

For example, the camera module 29a may be a device for recording still images and videos, and may include, according to an embodiment of the present disclosure, one or more image sensors (e.g., front and back sensors), a lens, an ISP, or a flash such as a light emitting diode (LED) or xenon lamp.

The power management module 29d may manage power of the electronic device 20, for example. Although not shown, according to an embodiment of the present disclosure, the power management module 29d may include a power management IC (PMIC), a charger IC, or a battery or fuel gauge. The PMIC may have a wired and/or wireless recharging scheme. The wireless charging scheme may include a magnetic resonance scheme, a magnetic induction scheme, or an electromagnetic wave based scheme, and an additional circuit, such as a coil loop, a resonance circuit, a rectifier, or the like may be added for wireless charging. The battery gauge may measure an amount of remaining power of the battery 29e, a voltage, a current, or a temperature while the battery 29e is being charged. The battery 29e may include a rechargeable battery or a solar battery.

The indicator 29b may indicate a particular state of the electronic device 20 or a part (e.g., the processor 21) of the electronic device, including a booting state, a message state, or recharging state. The motor 29c may convert an electric signal to a mechanical vibration and may generate a vibrational or haptic effect. Although not shown, a processing unit for supporting mobile TV, such as a GPU may be included in the electronic device 20. The processing unit for supporting mobile TV may process media data conforming to a standard for digital multimedia broadcasting (DMB), digital video broadcasting (DVB), or mediaFlo™.

Each of the aforementioned components of the electronic device may include one or more parts, and a name of the part may vary with a type of the electronic device. The electronic device in accordance with various embodiments of the present disclosure may include at least one of the aforementioned components, omit some of them, or include other additional component(s). Some of the components may be combined into an entity, but the entity may perform the same functions as the components may do.

The term 'module' may refer to a unit including one of hardware, software, and firmware, or a combination thereof. The term 'module' may be interchangeably used with a unit, logic, logical block, component, or circuit. The module may be a minimum unit or part of an integrated component. The module may be a minimum unit or part of performing one or more functions. The module may be implemented mechanically or electronically. For example, the module may include at least one of application specific IC (ASIC) chips, field programmable gate arrays (FPGAs), or programmable logic arrays (PLAs) that perform some operations, which have already been known or will be developed in the future.

According to an embodiment of the present disclosure, at least a part of the device (e.g., modules or their functions) or method (e.g., operations) may be implemented as instructions stored in a computer-readable storage medium e.g., in the form of a program module. The instructions, when executed by a processor, may cause the processor to carry out a corresponding function.

The computer-readable storage medium may include a hardware device, such as hard discs, floppy discs, and magnetic tapes (e.g., a magnetic tape), optical media such as compact disc ROMs (CD-ROMs) and digital versatile discs (DVDs), magneto-optical media such as floptical disks, ROMs, RAMs, flash memories, and/or the like. Examples of the program instructions may include not only machine language codes but also high-level language codes which are executable by various computing means using an interpreter. The aforementioned hardware devices may be configured to operate as one or more software modules to carry out various embodiments of the present disclosure, and vice versa.

Figure 8:
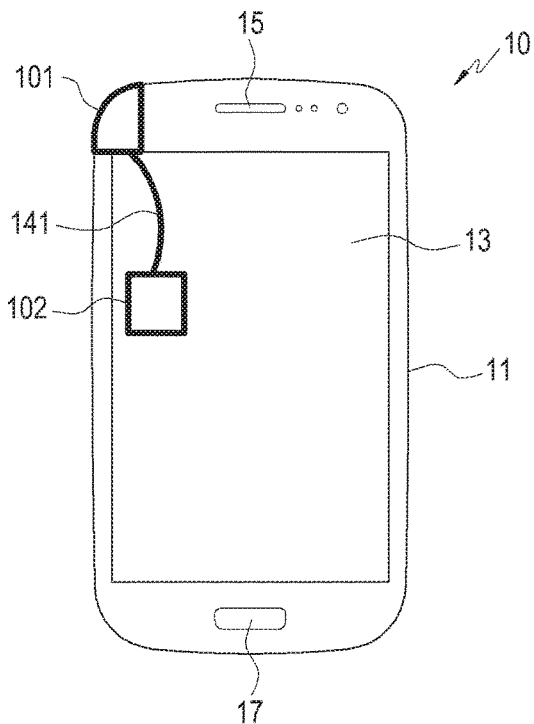
FIG. 8 is a view illustrating an electronic device including an antenna device according to an embodiment of the present disclosure.
Figure 9:
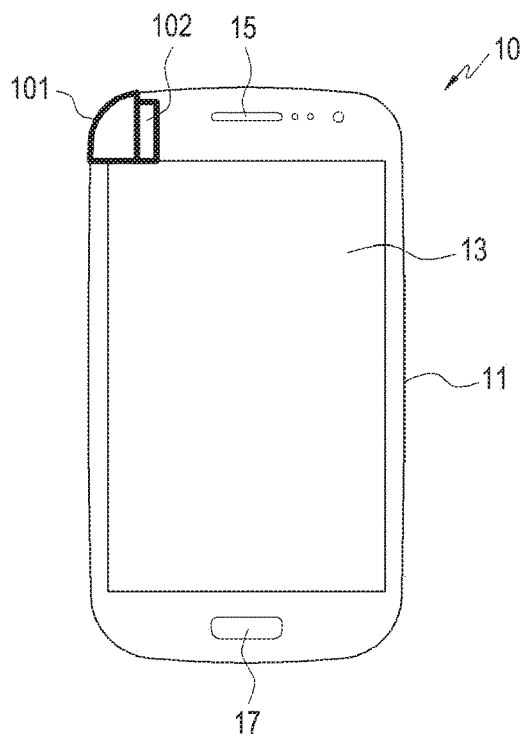
FIG. 9 is a view illustrating an electronic device including an antenna device according to an embodiment of the present disclosure.

FIG. 8 is a view illustrating an electronic device 10 including an antenna device according to an embodiment of the present disclosure. FIG. 9 is a view illustrating an electronic device 10 including an antenna device according to an embodiment of the present disclosure.

Referring to FIGS. 8 and 9, the electronic device(s) may include the whole or part of the above-described electronic device or may be implemented with a combination of at least one or two of the above-described antenna devices 100, 100a, 100b, and 100c. The electronic device 10 may be formed in a single housing 11, and a display device 13 may be installed on a front surface of the housing 11. A speaker 15 for outputting sound and a keypad 17, respectively, may be disposed at an upper side and lower side of the display device 13.

According to an embodiment of the present disclosure, it has been described above that the antenna device 100, 100a, 100b, or 100c may be provided with the RF module 101 separated or integrated with the BB module 102.

Referring to FIG. 8, the RF module 101 may be disposed in an edge at a side of the housing 11 while separated from the BB module 102. For example, the RF module 101 may be placed at a position on the housing 11, where the RF module 101 may exert the optimal radiation capability, and the RF module 101 may be coupled with the BB module 102 through a connecting member 141, e.g., a coaxial cable. As set forth above, the RF module 101 includes the first radiating conductors 115a and 115b able to form broadside radiation and fireend radiation, allowing for omni-directional characteristics. Accordingly, as the RF module 101 is installed on the housing 11 while separated from the BB module 102, the electronic device 10 may perform stable communication of wireless signals through the antenna device 100, 100a, 100b, or 100c, e.g., via the RF module 101.

Referring to FIG. 9, the RF module 101 may be disposed in an edge at a side of the housing 11 while integrated with the BB module 102. When the RF module 101 is integrated with the BB module 102, the first radiating conductors 115a and 115b arranged in the RF module 101 may experience a distortion in the radiation capability, and as the operation frequency band increases, such distortion may worsen. According to an embodiment of the present disclosure, the antenna device 100, 100a, 100b, or 100c may compensate for the distortion in the radiation capability using the second radiating conductors 125a and 125b arranged in the BB module 102, allowing the communication of wireless signals to remain stable. Further, when the third radiating conductors 125c are arranged in the BB module 102, the electronic device 10 may perform wireless communication on a frequency band different from that of the first radiating conductors.

As described above, according to an embodiment of the present disclosure, the antenna device may comprise an RF module including a plurality of first radiating conductors and an RFIC integrated with the first radiating conductors and a BB module including second radiating conductors respectively corresponding to some of the first radiating conductors and a BBIC integrated with the second radiating conductors, wherein the RF module may be combined with the BB module via a cable or to be positioned facing the BB module to be electrically connected with the BB module.

According to an embodiment of the present disclosure, while the RF module is combined with the BB module, some of the first radiating conductors corresponding to the second radiating conductors may be provided as soldering pads.

According to an embodiment of the present disclosure, the second radiating conductors may receive electricity from the RFIC via one of the first radiating conductors respectively provided as soldering pads.

According to an embodiment of the present disclosure, the second radiating conductors may be arranged on a surface positioned opposite the RF module, forming broadside radiation.

According to an embodiment of the present disclosure, at least some of the second radiating conductors may be arranged on a side surface of the BB module or parallel with the side surface thereof, forming endfire radiation.

According to an embodiment of the present disclosure, the RF module further may further include a circuit board having a first surface positioned facing the BB module, some of the first radiating conductors arranged on the first surface and first via holes formed through the circuit board and respectively connected with the first radiating conductors on the first surface. The first radiating conductors on the first surface may receive electricity through the first via holes.

According to an embodiment of the present disclosure, while the RF module is combined with the BB module to be positioned facing the BB module, the first radiating conductors arranged on the first surface may be provided as the soldering pads, and the second radiating conductors may receive electricity from the RFIC via one of the first radiating conductors respectively provided as the soldering pads.

According to an embodiment of the present disclosure, the RF module may further include a plurality of second via holes formed through the circuit board, and the second via holes may be arranged around the first via holes to provide a ground.

According to an embodiment of the present disclosure, the RF module may further include a conductive layer formed on, at least, the first surface of the circuit board and a plurality of slots formed in the conductive layer, wherein some of the first radiating conductors may be arranged in the slots.

According to an embodiment of the present disclosure, the RF module may further include a plurality of second via holes formed through the circuit board, and the second via holes may be arranged around the first via holes to, together with the conductive layer, provide a ground.

According to an embodiment of the present disclosure, the RF module may further include a circuit board having a conductive layer formed on at least a surface thereof and a plurality of slots formed in the conductive layer, wherein some of the first radiating conductors may be arranged in the slots.

According to an embodiment of the present disclosure, the BB module may further include a circuit board including a conductive layer formed on, at least, a surface thereof, which is positioned opposite the RF module and a plurality of slots formed in the conductive layer, wherein the second radiating conductors may be arranged in the slots.

According to an embodiment of the present disclosure, the RF module may include a circuit board including a plurality of layers, conductors arranged on at least one of a surface or opposite surface of each of the layers, and via holes formed through the layers to connect the conductors arranged on different surfaces of the layers to form a mesh grid structure. At least one of the first radiating conductors is implemented with the conductors and the via holes forming the mesh grid structure.

According to an embodiment of the present disclosure, the first radiating conductor implemented with the conductors and the via holes may form endfire radiation.

According to an embodiment of the present disclosure, the RF module may further include soldering pads provided on a surface of the circuit board and connected with the first radiating conductors. While the RF module is combined with the BB module to be positioned facing the BB module, the second radiating conductors may receive electricity from the RFIC through the soldering pads.

According to an embodiment of the present disclosure, the BB module may include a circuit board including a plurality of layers, conductors arranged on at least one of a surface or opposite surface of each of the layers, and via holes formed through the layers to connect the conductors arranged on different surfaces of the layers to form a mesh grid structure. At least one of the second radiating conductors is implemented with the conductors and the via holes forming the mesh grid structure.

According to an embodiment of the present disclosure, the second radiating conductor implemented with the conductors and the via holes may receive electricity from the RFIC to form endfire radiation.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An antenna device comprising:
  a radio frequency (RF) module comprising:
    a first circuit board;
    a plurality of first radiating conductors arranged on the first circuit board;
    an RF integrated chip (RFIC) disposed on one surface of the first circuit board and integrated with the plurality of first radiating conductors; and
  a baseband (BB) module comprising:
    a plurality of second radiating conductors respectively corresponding to a portion of the plurality of first radiating conductors; and
    a BB integrated chip (BBIC) integrated with the plurality of second radiating conductors,
  wherein the RF module is combined with the BB module to be positioned while the one surface of the first circuit board facing the BB module and the RF module is electrically connected with the BB module,
  wherein a first portion of the plurality of first radiating conductors are disposed on the one surface of the first circuit board and a second portion of the plurality of first radiating conductors are disposed on another surface of the first circuit board,
  wherein a portion of the plurality of second radiating conductors are configured to receive electricity from the RFIC via one of the first portion of the plurality of first radiating conductors, and
  wherein the second portion of the plurality of first radiating conductors are configured to receive electricity from the RFIC.

2. The antenna device of claim 1, wherein, when the first portion of the plurality of first radiating conductors corresponding to the plurality of second radiating conductors are provided as soldering pads.

3. The antenna device of claim 2, wherein the first portion of the plurality of first radiating conductors provided as the soldering pads are configured to supply electricity received from the RFIC to the plurality of second radiating conductors.

4. The antenna device of claim 3, wherein the portion of the plurality of second radiating conductors are arranged on a surface positioned opposite the RF module and configured to form broadside radiation.

5. The antenna device of claim 3, wherein another portion of the plurality of second radiating conductors are arranged on a side surface of the BB module or parallel with the side surface thereof to form endfire radiation.

6. The antenna device of claim 1,
  wherein the first circuit board has first via holes formed through the first circuit board; and
  wherein the first portion of the plurality of first radiating conductors arranged on the one surface are respectively connected with the first via holes and configured to receive electricity through the first via holes from the RF module.

7. The antenna device of claim 6,
  wherein, when the RF module is combined with the BB module to be positioned facing the BB module,
    the first portion of the plurality of first radiating conductors are provided as soldering pads, and
    the portion of the plurality of second radiating conductors are configured to receive electricity from the RFIC via one of the first portion of the plurality of first radiating conductors respectively provided as the soldering pads.

8. The antenna device of claim 6,
  wherein the RF module further comprises:
    a plurality of second via holes formed through the first circuit board; and
  wherein the second via holes are arranged around the first via holes to provide a ground.

9. The antenna device of claim 6,
  wherein the RF module further comprises:
    a conductive layer formed on, at least, the first surface of the first circuit board; and
    a plurality of slots formed in the conductive layer; and
  wherein the first portion of the plurality of first radiating conductors are arranged in the slots.

10. The antenna device of claim 9,
  wherein the RF module further comprises:
    a plurality of second via holes formed through the first circuit board; and
  wherein the second via holes are arranged around the first via holes, and the second via holes, together with the conductive layer, provide a ground.

11. The antenna device of claim 1,
  wherein the RF module further comprises:
    a conductive layer formed on at least a surface of the first circuit board; and
    a plurality of slots formed in the conductive layer; and
  wherein a portion of the plurality of first radiating conductors are arranged in the slots.

12. The antenna device of claim 1,
  wherein the BB module further comprises:
    a second circuit board including a conductive layer formed on, at least,
    a surface thereof, which is positioned opposite the RF module; and
    a plurality of slots formed in the conductive layer, and
  wherein the portion of the plurality of second radiating conductors are arranged in the slots.

13. The antenna device of claim 1,
  wherein the RF module further comprises:
    a plurality of layers forming the first circuit board;
    a plurality of conductors arranged on at least one of a surface or opposite surface of each of the layers; and
    a plurality of via holes formed through the layers to connect the conductors arranged on different surfaces of the layers to form a mesh grid structure; and
  wherein a third portion of the plurality of first radiating conductors are implemented with the conductors and the via holes to form the mesh grid structure.

14. The antenna device of claim 13, wherein the third portion of the plurality of first radiating conductors implemented with the conductors and the via holes are configured to form endfire radiation.

15. The antenna device of claim 13,
  wherein the RF module further comprises:
    soldering pads provided on the one surface of the first circuit board, the soldering pads being connected with the third portion of the plurality of first radiating conductors; and
  wherein, when the RF module is combined with the BB module to be positioned facing the BB module, another portion of the plurality of second radiating conductors are configured to receive electricity from the RFIC through the soldering pads.

16. The antenna device of claim 1,
wherein the BB module comprises a second circuit board, the second circuit board comprising:
- a plurality of layers;
- a plurality of conductors arranged on at least one of a surface or an opposite surface of each of the layers; and
- a plurality of via holes formed through the layers for connecting the conductors arranged on different surfaces of the layers to form a mesh grid structure; and wherein another portion of the plurality of second radiating conductors are implemented with the conductors and the via holes to form the mesh grid structure.

17. The antenna device of claim 16, wherein at least one of the other portion of the plurality of second radiating conductors, implemented with the conductors and the via holes, is configured to receive electricity from the RFIC to form endfire radiation.

18. The antenna device of claim 1, wherein the second portion of the plurality of first radiating conductors are configured to form broadside radiation in a first direction using electricity received from the RFIC, and
wherein the portion of the second radiating conductors are configured to form broadside radiation in a second direction opposite to the first direction using electricity received from the RFIC via one of the first portion of the plurality of first radiating conductors.

19. An electronic device comprising:
an antenna device comprising:
a radio frequency (RF) module comprising:
- a first circuit board;
- a plurality of first radiating conductors arranged in or on the first circuit board;
- an RF integrated chip (RFIC) disposed on one surface of the first circuit board and integrated with the plurality of first radiating conductors; and a baseband (BB) module comprising:
- a plurality of second radiating conductors respectively corresponding to a portion of the plurality of first radiating conductors; and
- a BB integrated chip (BBIC) integrated with the plurality of second radiating conductors, wherein the RF module is combined with the BB module to be positioned while the one surface of the first circuit board facing the BB module and the RF module is electrically connected with the BB module,
wherein a first portion of the plurality of first radiating conductors are disposed on the one surface of the first circuit board and a second portion of the plurality of first radiating conductors are disposed on another surface of the first circuit board,
wherein a portion of the plurality of second radiating conductors are configured to receive electricity from the RFIC via one of the first portion of the plurality of first radiating conductors, and
wherein the second portion of the plurality of first radiating conductors are configured to receive electricity from the RFIC.

20. The electronic device of claim 19, wherein, when the RF module is combined with the BB module to be positioned facing the BB module, the first portion of the plurality of first radiating conductors corresponding to the plurality of second radiating conductors are provided as soldering pads.

21. The electronic device of claim 19,
wherein the first circuit board has first via holes formed through the first circuit board; and
wherein the second portion of the plurality of first radiating conductors arranged on the first surface are respectively connected with the first via holes and configured to receive electricity through the first via holes from the RF module.

* * * * *